(12) United States Patent
Ren

(10) Patent No.: US 8,970,275 B1
(45) Date of Patent: Mar. 3, 2015

(54) PROCESS COMPENSATED DELAY LINE

(75) Inventor: Guo Jun Ren, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1142 days.

(21) Appl. No.: 12/107,091

(22) Filed: Apr. 22, 2008

(51) Int. Cl.
*H03H 11/26* (2006.01)
*H01L 35/00* (2006.01)
*H01L 37/00* (2006.01)

(52) U.S. Cl.
USPC ........... 327/261; 327/262; 327/266; 327/280; 327/287; 327/512; 327/513

(58) Field of Classification Search
USPC ................... 327/170, 261, 262, 512, 513, 538
See application file for complete search history.

(56) References Cited

U.S. PATENT DOCUMENTS

| | | | |
|---|---|---|---|
| 5,486,786 A | 1/1996 | Lee | |
| 5,495,184 A * | 2/1996 | Des Rosiers et al. | 326/73 |
| 5,892,409 A | 4/1999 | Boerstler | |
| 5,990,711 A * | 11/1999 | Sekimoto | 327/112 |
| 6,054,884 A | 4/2000 | Lye | |
| 6,281,729 B1 | 8/2001 | Ang et al. | |
| 6,288,613 B1 | 9/2001 | Bennett | |
| 6,441,594 B1 | 8/2002 | Connell et al. | |
| 6,566,900 B2 | 5/2003 | Amick et al. | |
| 6,903,588 B2 * | 6/2005 | Vorenkamp | 327/170 |
| 7,038,482 B1 | 5/2006 | Bi | |
| 7,119,528 B1 | 10/2006 | Rasmus | |
| 7,202,715 B1 | 4/2007 | Fan | |

OTHER PUBLICATIONS

Sundaresan, Krishnakumar et al.; "A 7-MHz Process, Temperature and Supply Compensated Clock Oscillator in 0.25um CMOS"; Circuits and Systems; 2003; ISCAS'03; Proceedings of the 2003 International Symposium on; vol. 1, May 25-28, 2003; pp. I-693 thru I-696.

* cited by examiner

*Primary Examiner* — Lincoln Donovan
*Assistant Examiner* — Colleen O Toole
(74) *Attorney, Agent, or Firm* — Annette M. Thompson; LeRoy D. Maunu

(57) ABSTRACT

An integrated circuit that equalizes delay across process corners. A delay equalizer circuit is used to adjust and maintain a relatively constant delay across different process corners. The delay equalizer circuit includes a process monitor and a delay compensator circuit coupled to the process monitor. The process monitor may output a compensating bias voltage for a pMOS transistor and a compensating bias voltage for an nMOS transistor. The compensating bias voltages may be used to regulate and maintain a relatively constant delay through the delay compensator circuit across varying process corners.

11 Claims, 7 Drawing Sheets

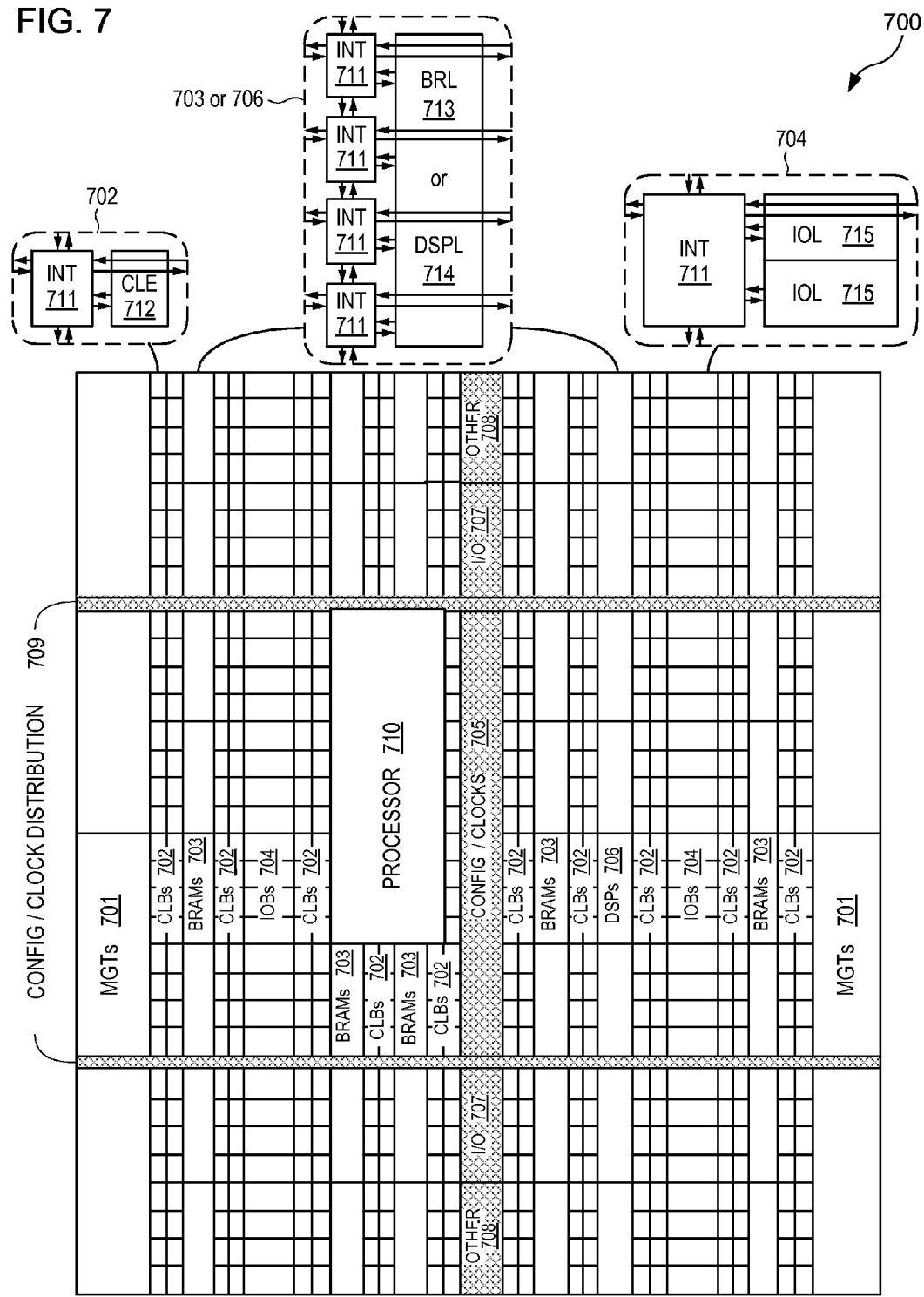

PROCESS COMPENSATED DELAY LINE

FIELD OF THE INVENTION

This disclosure relates generally to skew reduction and more particularly to a method and circuit for equalizing delay across process corners.

BACKGROUND

During the fabrication of a semiconductor design, process variations during fabrication may affect the performance of a metal oxide semiconductor field effect (MOSFET) transistor. Process variations may be primarily due to physical factors such as variations in gate oxide thickness, doping concentrations, and transistor channel length, among other factors. These physical factors may be characterized by parameters in process models that capture circuit performance changes based on parameter variations. The process models are called process corners, because the circuit performances resulting from the process model variations may be characterized as typical, slow, or fast.

Threshold voltage and/or electron mobility are process corner parameters that are critical to transistor performance. The threshold voltage of a transistor represents the voltage point where the gate to source voltage of a transistor turns on the transistor to an active conducting state. Slight changes in threshold voltage often produce significant changes in transistor performance. The performance of an n-channel MOSFET (nMOS) transistor and a p-channel MOSFET (pMOS) transistor may be individually characterized as fast, slow, or typical performance relative to the threshold voltage of a particular process corner.

For example, in a particular process corner, the performance of the nMOS transistors may be slow and the performance of the pMOS transistors may be slow. Therefore, the process corner is characterized as a slow-slow (SS) corner, i.e., slow nMOS and slow pMOS. Similarly, there may be the fast-fast (FF) process corner, i.e., fast nMOS, fast pMOS; fast-slow (FS) process corner, i.e., fast nMOS and slow pMOS; and slow-fast process corner (SF), slow nMOS and fast pMOS.

The implementation of some types of integrated circuits, such as pre-emphasis and de-emphasis devices and clock circuitry, may require a certain amount of delay. The delay is typically implemented using a simple CMOS-based inverter chain.

FIG. 1 illustrates a typical inverter chain delay line 100 having a number of stages. It must be noted that the number of inverter stages may vary depending on implementation. An input 10 to delay line 100 may produce a delayed output 80. The delay through inverter chain 100 is not constant and may vary, e.g., up to a 4× change in delay, across different process corners. For example, the delay through an inverter in an FF process corner may be 20 picoseconds (ps). The delay through the same inverter in a SS process corner may increase to 80 ps. The delay increase represents a 4× change in delay from the FF process corner to the SS process corner. This delay variation impacts circuit performance, for example, the maximum speed at which the circuit can operate.

SUMMARY

This disclosure describes a new approach to reducing skew and equalizing delay across process corners using a delay equalizer circuit. A delay equalizer circuit uses a process monitor to sense a process corner in which a circuit may be operating. The process monitor outputs bias voltages that regulate the delay through a delay line.

According to a disclosed class of innovative embodiments, there is disclosed an integrated circuit that minimizes delay. The integrated circuit comprises a semiconductor substrate, a plurality of CMOS circuit elements formed on the substrate, and a delay equalizer circuit (DEQ), wherein a delay from an input to the DEQ to an output of the DEQ is relatively constant across a plurality of process corners for the integrated circuit.

According to a disclosed class of innovative embodiments, there is disclosed a delay equalizer circuit which comprises a process monitor; and a delay compensator cross-coupled to the process monitor.

According to another disclosed class of innovative embodiments, a method of reducing delay variation across process corners comprises generating a first bias voltage from a p-type metal oxide semiconductor (pMOS) transistor diode-connected transistor, generating a second bias voltage from an n-type metal oxide semiconductor transistor (nMOS) diode-connected transistor, generating a pMOS process-dependent reference current based on the second bias voltage, generating an nMOS process-dependent reference current based on the first bias voltage, and compensating a delay based on the pMOS process-dependent reference current and the nMOS process-dependent reference current.

The embodiments of the disclosure provide the advantage of reducing delay variations across the different process corners of an integrated circuit.

The embodiments of the disclosure also provide the advantage of not requiring the use of a delay locked loop which uses an external clock frequency to adjust the delay through a circuit.

These and other advantages will be more clearly understood from the following detailed description taken in conjunction with the accompanying drawings and claims.

BRIEF DESCRIPTION OF THE DRAWINGS

For a more complete understanding of the disclosure and the advantages thereof, reference is now made to the accompanying drawings, wherein similar or identical reference numerals represent similar or identical elements.

FIG. 7 is a diagram of an exemplary system capable of utilizing the teaching of the current disclosure.

DETAILED DESCRIPTION

The innovative teachings of the present disclosure will be described with particular reference to presently preferred embodiments. The disclosure should in no way be limited to the implementations, drawings, and techniques illustrated and described herein, but may be modified within the scope of the appended claims along with their full scope of equivalents.

In embodiments of this disclosure, a delay equalizer maintains a constant delay across different process corners. The delay equalizer uses a process monitor to determine the process corner in which a circuit may be operating. The process monitor outputs pMOS and nMOS bias voltages relative to operating in a particular process corner. The delay equalizer may use the bias voltages to control and adjust a delay from input to output through a current-starved delay chain. The delay adjustment may allow the delay through the current-starved delay chain to remain relatively constant.

Figure 1:
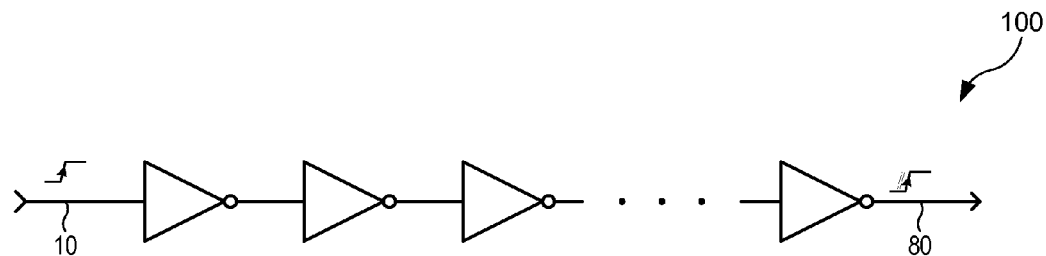
FIG. 1 illustrates a typical inverter delay chain.
Figure 2:
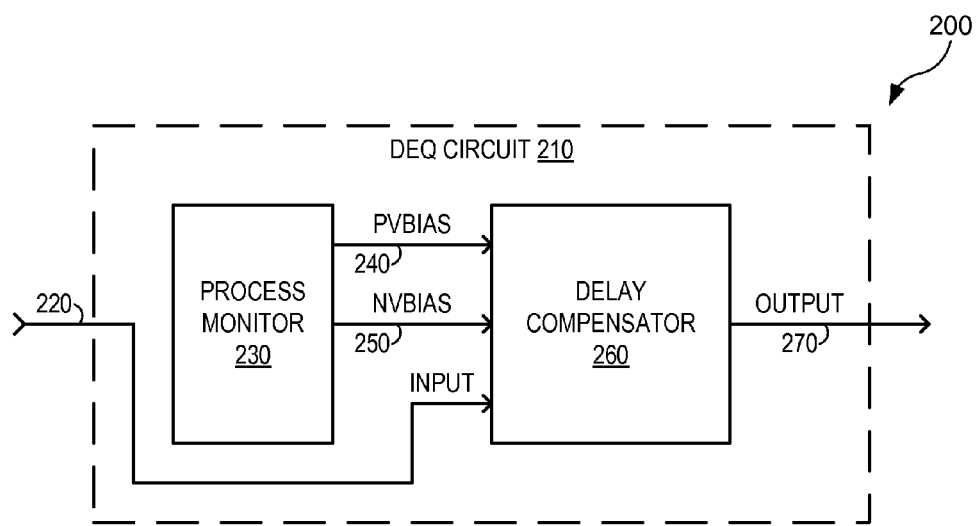
FIG. 2 illustrates a delay equalizer circuit according to one embodiment of the disclosure.

FIG. 2 illustrates top level block diagram 200 of a delay equalization circuit, referred to herein as a delay equalizer. Delay Equalizer circuit (DEQ) 210 accepts an input 220 and produces an output 270 that has a relatively constant delay relative to the input 220. For example, the delay variation through the DEQ 210 circuit may be reduced by a factor of two compared to the inverter delay chain of FIG. 1. In one embodiment, the input may be a clock. In another embodiment, the input may be data. In yet another embodiment, the input may be a pulse, which may be a clock or data. One of skill in the art will recognize that the types of input may vary depending on implementation requirements. DEQ 210 may be comprised of a process monitor (PCMonitor 230) and a delay compensator (DLComp 260), as shown in FIG. 2.

PCMonitor 230 may output a pMOS bias voltage (PVBias 240) and an nMOS bias voltage (NVBias 250) to the DLComp 260. DLComp 260 may accept an input 220 and bias voltages (PVBias 240 and NVBias 250). PVBias 240 is a bias voltage for pMOS transistors, and NVBias 250 is a bias voltage for nMOS transistors. DLComp 260 may use PVBias 240 and NVBias 250 to regulate the delay of input signal 220 through DLComp 260. The delay regulation may result in the output signal 270 from DLComp 260 being relatively constant across the different process corners. For example, in one embodiment, a relatively constant variation may be considered as a 2× factor delay variation from a SS process corner to a FF process corner. In another embodiment, a relatively constant variation may be considered as a 1.5 factor delay variation. One of skill in the art will recognize that circuit implementation, for example, transistor sizing and voltage, may also be factors in determining a delay variation.

DEQ 210 may be used as a part of any circuit or system where a relatively constant delay may be desired across the different process corners. In one embodiment, for example, a pre-emphasis clock driver may require the use of a DEQ 210 to maintain a relatively constant delay across an integrated circuit.

Figure 3:
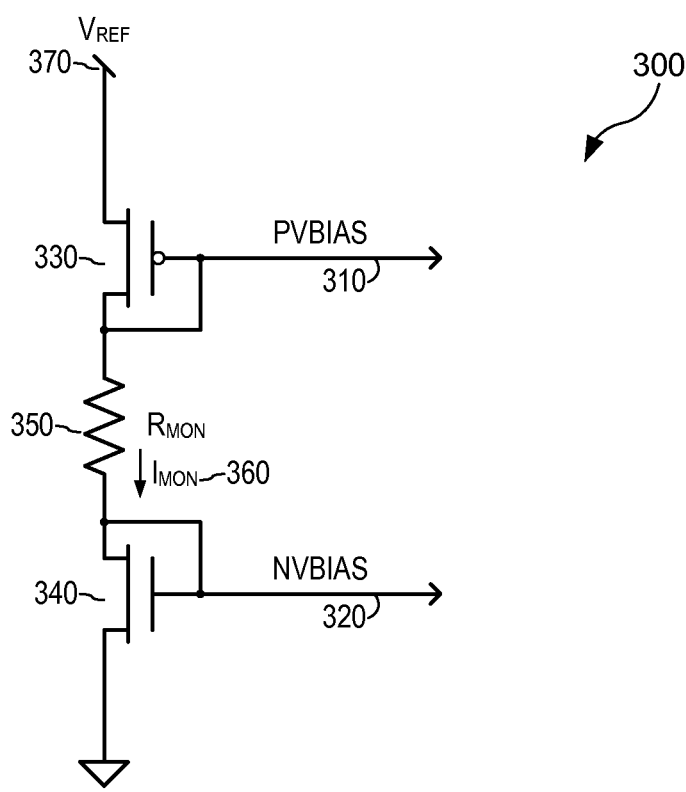
FIG. 3 illustrates a process monitor component of the delay equalizer circuit according to one embodiment of the disclosure.

In FIG. 3, diagram 300 illustrates the details of process monitor block 230 according to one embodiment of the current disclosure. PCMonitor circuit 300 may sense a threshold voltage of the transistors in a particular process corner and output bias voltages PVBias 310 and NVBias 320. The output bias voltages, PVBias 310 and NVBias 320, provide an indicator of the process corner in which the transistors may be operating.

PCMonitor 300 may be comprised of one pMOS transistor 330, one nMOS transistor 340, and one resistor, $R_{MON}$ 350. PMOS transistor 330, with its gate tied to drain, functions as a pMOS diode transistor. NMOS transistor 340, with its gate tied to drain, functions as an nMOS diode transistor. PMOS transistor 330 and nMOS transistor 340 may operate in a saturation region. A transistor may be determined to operate in a saturation region when its drain current is dependent on the voltage across its gate-to-source and not across the drain-to-source. Although the reference voltage, VREF 370, may change, the threshold voltage controls the voltage PVBias 310 across the pMOS diode transistor. For example, at a slow process corner the threshold voltage may be higher than at a fast process corner. Similarly, the gate-to-source voltage across the nMOS transistor NVBias 320 is a function of the gate-to-source voltage, which is a function of $R_{MON}$ 350 and the current $I_{MON}$ 360.

Figure 4:
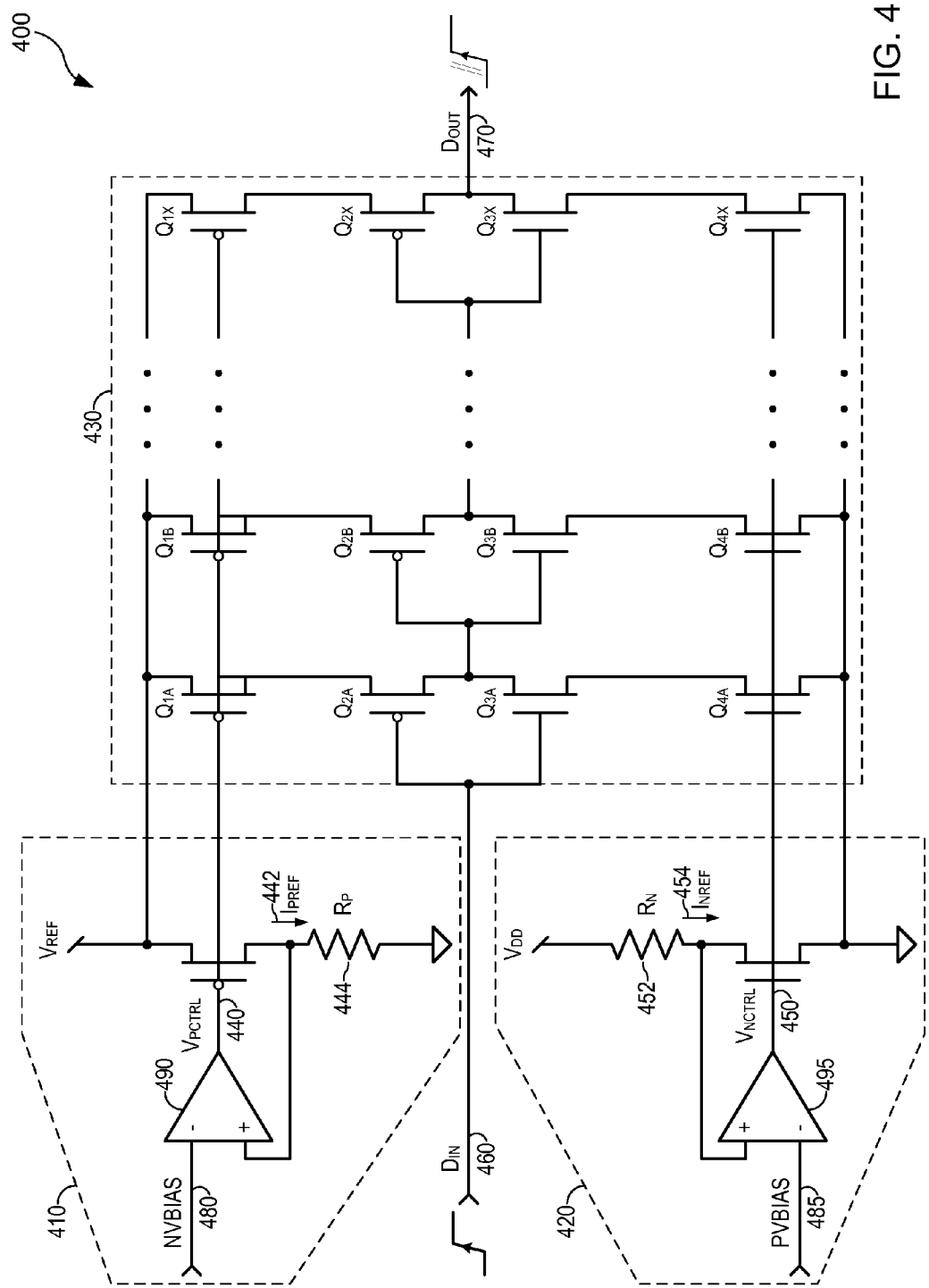
FIG. 4 illustrates a process compensated delay line component of the delay equalizer circuit according to one embodiment of the disclosure.

In FIG. 4, schematic 400 illustrates the details of the delay compensator circuit DLComp according to one embodiment of the current disclosure. In one embodiment, the delay compensator comprises a current-starved delay chain 430. Transistors Q1A, Q2A, Q3A, Q4A, Q1B, Q2B, Q3B, Q4B, Q1X, Q2X, Q3X, and Q4X form three stages of the current-starved delay chain 430. It must be noted that the number of stages of the current-starved delay chain 430 may vary depending on the amount of delay that may be required by a particular implementation.

The delay through the current-starved delay chain 430 is regulated by voltage controlled pMOS op-amp current source 410 and voltage controlled nMOS op-amp current source 420, which together implement a reference current generator. For example, the overall delay from Din 460 to Dout 470 and the delay through each inverter stage in the current-starved delay chain 430 may be controlled or adjusted by the amount of current that is allowed to pass through each inverter stage. For the pMOS transistor, the reference current is $I_{PREF}$ 442 and for the nMOS transistor, the reference current is $I_{NREF}$ 454.

The PVBias 485 and NVBias 480 voltages that are input to the DLComp from the PCMonitor may be cross-coupled to the inverting inputs of differential amplifiers 495 and 490, respectively. Specifically, the PVBias voltage may be coupled to the inverting input of a differential amplifier that drives an nMOS current source and the NVBias voltage may be coupled to the inverting input of a differential amplifier that drives a pMOS current source. The output voltage of the pMOS differential amplifier, $V_{PCTRL}$, and the output voltage of the nMOS differential amplifier, $V_{NCTRL}$, are amplified to control the reference currents $I_{PREF}$ 442 and $I_{NREF}$ 454, respectively. The reference currents may be replicated across the current-starved delay chain and used to control a relatively constant delay through each stage in the current-starved delay chain.

Figure 5A:
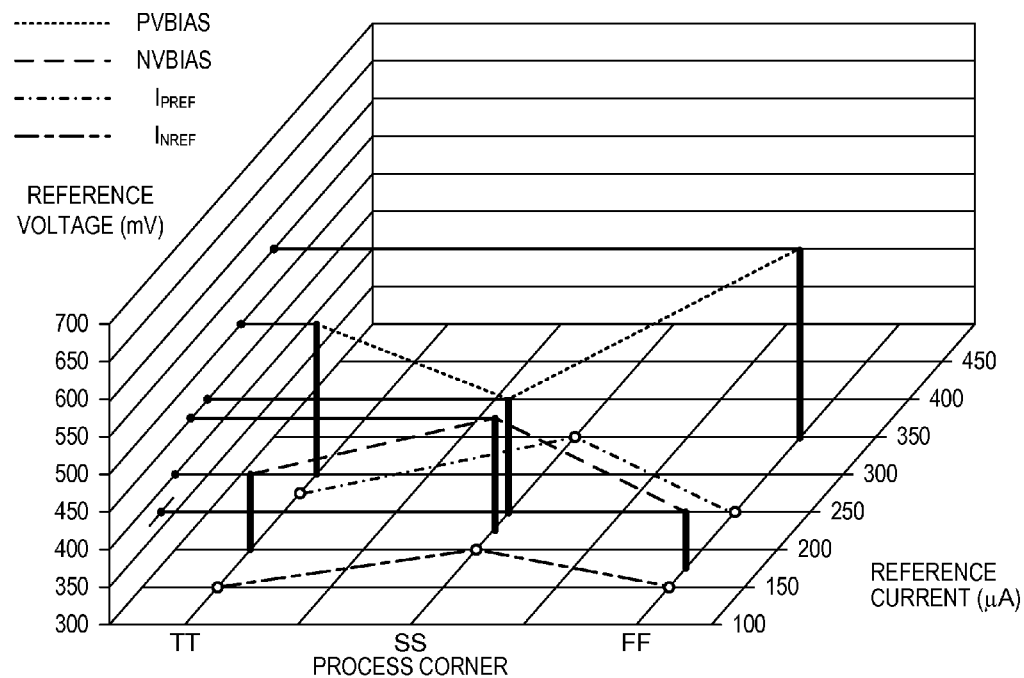
FIGS. 5A, 5B, and 5C are diagrams that illustrate the change in reference voltage and reference current across process corners according to an embodiment of the disclosure.
Figure 5B:
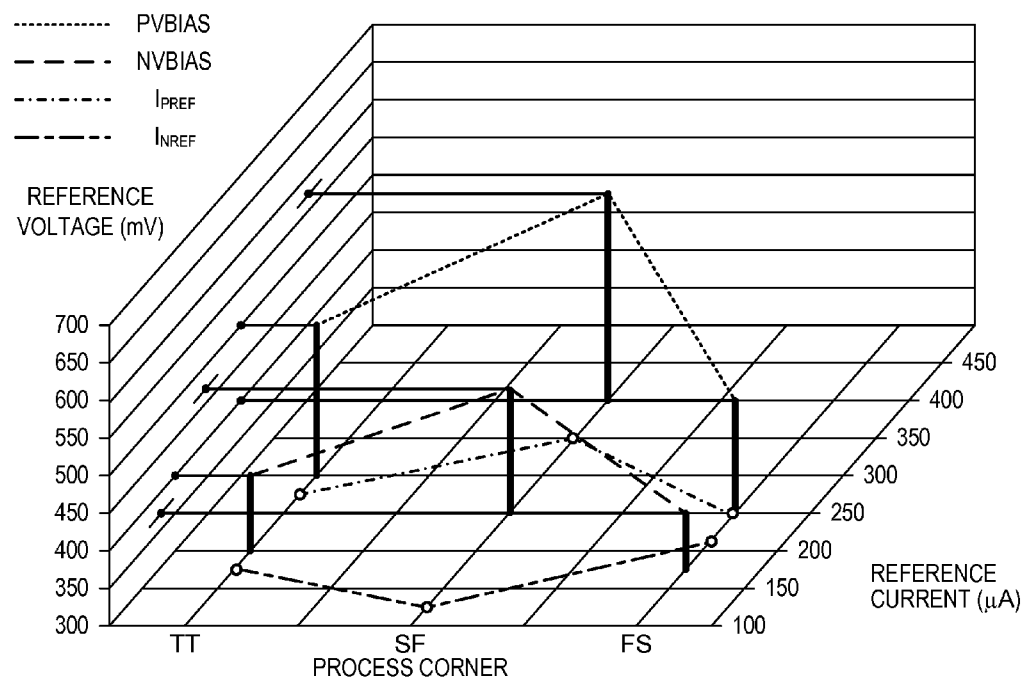
Figure 5C:
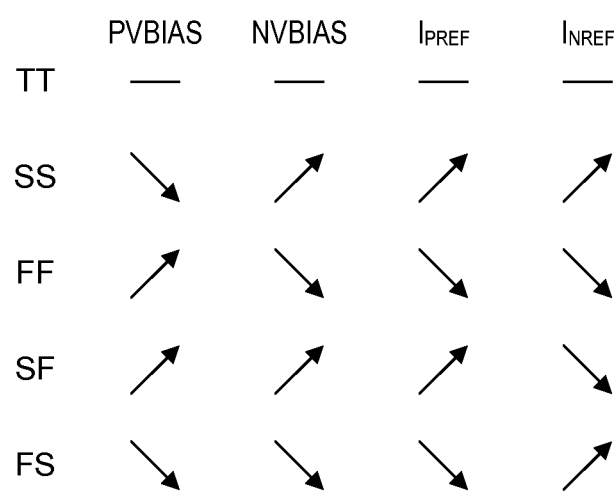

FIGS. 5A-5C illustrate how the reference voltages and reference current may vary with the change across process corners. FIG. 5A illustrates the change in the PVBias and NVBias reference voltages from a typical-typical (TT) process corner to a slow-slow (SS) process corner to a fast-fast (FF) process corner. FIG. 5B illustrates the change in the PVBias and NVBias reference voltages from a typical-typical process corner to a slow-fast (SF) process corner to a fast-slow (FS) process corner. FIG. 5C is another representation of the information depicted in FIGS. 5A and 5B. The arrows pointing upward denote an increase in voltage and the arrows pointing downward denote a decrease in voltage. For example, in one embodiment the process corner may be an SS process corner. The bias voltage PVBias may be expected to decrease and the bias NVBias voltage may be expected to increase. The changes in the PVBias and NVBias voltages in the SS process corner may cause an increase in reference current $I_{PREF}$ and an increase in reference current $I_{NREF}$.

In another embodiment of FIG. 5C, the process corner may be an FF process corner. In an FF process corner, the bias voltage PVBias may be expected to increase and the bias voltage NVBias may be expected to decrease. The changes in the PVBias and NVBias voltages in the FF process corner may cause a decrease in reference current $I_{PREF}$ and a decrease in reference current $I_{NREF}$.

In yet another embodiment of FIG. 5C, the process corner may be an SF process corner. In an SF process corner, the bias voltage PVBias may be expected to increase and the bias voltage NVBias may be expected to increase. The changes in the PVBias and NVBias voltages in the SF process corner may cause an increase in reference current $I_{PREF}$ and a decrease in reference current $I_{NREF}$.

In another embodiment of FIG. 5C, the process corner may be an FS process corner. In an FS process corner, the bias voltage PVBias may be expected to decrease and the bias voltage NVBias may be expected to decrease. The changes in the PVBias and NVBias in the FS process corner may cause a decrease in reference current $I_{PREF}$ and an increase in reference current $I_{NREF}$.

Figure 6:
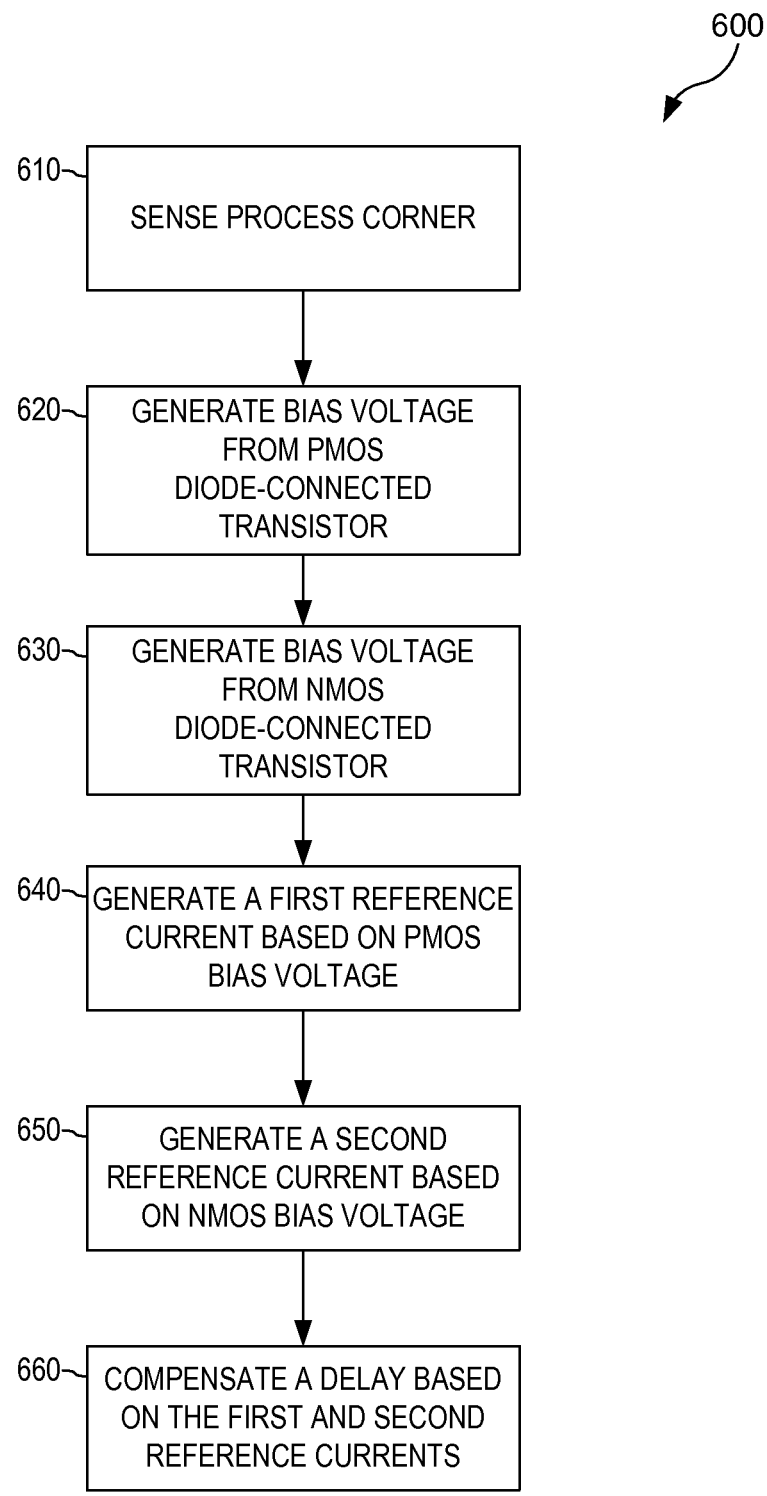
FIG. 6 is a flowchart of a method according to one embodiment of the disclosure.

FIG. 6 illustrates a flowchart 600 that outlines a method in accordance with one embodiment of the current disclosure. A process corner may be sensed at an action 610. The process corner may be a factor that determines whether a bias voltage may be increased or decreased. A bias voltage may be generated from a pMOS diode-connected transistor at an action 620. This bias voltage may be referred to as a pMOS bias voltage. The pMOS bias voltage may increase or decrease, depending on the process corner. A bias voltage may be generated from an nMOS diode-connected transistor at an action 630. This bias voltage may be referred to as an nMOS bias voltage. The nMOS bias voltage may increase or decrease, depending on the process corner. At an action 640, a first reference current is generated based on the pMOS bias voltage. At a block 650, a second reference current is generated based on the nMOS bias voltage. The first and second reference currents may be replicated in each leg of a current-starved inverter delay chain. The first and second reference currents function to control and compensate delay through the delay chain at an action 660.

Note that the actions illustrated in FIG. 6 need not take place in the order shown. For example, the pMOS and nMOS bias voltages may be generated concurrently, or in any order. Similarly, the first and second reference currents may be generated concurrently, or in any order.

FIG. 7 illustrates an exemplary system 700 that may be suitable for implementing the embodiments disclosed herein. In this embodiment, system 700 is a Field Programmable Gate Array (FPGA), a type of Programmable Logic Device (PLD). However, the disclosed embodiments may be implemented in other types of systems, including, for example, non-programmable or partially-programmable integrated circuits. System 700 may include a processor 710, a plurality of block random access memories (BRAMs) 703, a plurality of configurable logic blocks (CLBs) 702, configuration and clock logic 705, digital signal processors (DSPs) 706, input-output blocks (IOBs) 704, and multigigabit transceivers (MGTs) 701, for example. Other system blocks 708 may also be included. A delay equalizer such as those described herein may be used in the configuration/clock circuitry 705 to minimize the variations in the delays of the clock signals of the system.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various methods, techniques, or elements may be combined or integrated in another system, or certain features may be omitted or not implemented.

Also, techniques, systems, subsystems and methods described and illustrated in the various embodiments as discrete or separate may be combined or integrated with other systems, modules, techniques, or methods without departing from the scope of the present disclosure. Other examples of modifications, variations, substitutions, and alterations will be recognizable by one skilled in the art and could be made without departing from the spirit and scope disclosed herein.

Further, none of the description in the present disclosure should be read as implying that any particular element, act, or function is an essential element which must be included in the claim scope: The scope of patented subject matter is defined only by the claims.

The claims, as filed, are intended to be as comprehensive as possible, and no subject matter is intentionally relinquished, dedicated, or abandoned.

What is claimed is:

1. An integrated circuit that minimizes delay variation, the integrated circuit comprising:
    a delay equalizer circuit (DEQ),
    wherein:
        the DEQ includes a process monitor and a delay compensator;
        the process monitor includes a p-type metal oxide semiconductor (pMOS) diode transistor configured to generate and output a pMOS bias voltage and an n-type metal oxide semiconductor (nMOS) diode transistor configured to generate and output an nMOS bias voltage;
        the delay compensator includes one or more pMOS circuits and one or more nMOS circuits, and the delay compensator is cross coupled to the process monitor to bias the one or more pMOS circuits using the nMOS bias voltage, and bias the one or more nMOS circuits using the pMOS bias voltage; and
        a delay from an input to the DEQ to an output of the DEQ is relatively constant across a plurality of process corners for the integrated circuit.

2. The integrated circuit of claim 1, wherein the process monitor senses a process corner in which the integrated circuit is operating.

3. A delay equalizer circuit (DEQ), the circuit comprising:
    a process monitor;
    wherein the process monitor includes a p-type metal oxide semiconductor (pMOS) diode transistor configured to generate and output a pMOS bias voltage and an n-type metal oxide semiconductor (nMOS) diode transistor configured to generate and output an nMOS bias voltage; and
    a delay compensator cross-coupled to the process monitor;
    wherein the delay compensator includes:
        a reference current generator including:
            a first differential amplifier coupled to the nMOS bias voltage to generate a pMOS reference current; and
            a second differential amplifier coupled to the pMOS bias voltage to generate an nMOS reference current; and
        a current-starved delay chain including a plurality of pMOS transistors coupled to the pMOS reference current and a plurality of nMOS transistors coupled to the nMOS reference current;
    wherein the plurality of pMOS transistors is biased by the nMOS bias voltage, and the plurality of nMOS transistors is biased by the pMOS bias voltage.

4. The delay equalizer circuit of claim 3, wherein the process monitor further comprises:
  a resistor, wherein the resistor is juxtaposed between the pMOS diode transistor and the nMOS diode transistor, the drain of the pMOS transistor being connected to an end of the resistor and the drain of the nMOS transistor being connected to another end of the resistor.

5. The delay equalizer circuit of claim 3, wherein an inverting input of the first differential amplifier is coupled to receive the nMOS bias voltage and an inverting input of a second differential amplifier is coupled to receive the pMOS bias voltage.

6. The delay equalizer circuit of claim 3, wherein the reference current generator comprises a pMOS current source and an nMOS current source.

7. The delay equalizer circuit of claim 5, wherein:
  a non-inverting input of the first differential amplifier is coupled to a drain of a pMOS current source;
  a non-inverting input of a second differential amplifier is coupled to a drain of the nMOS current source;
  an output of the first differential amplifier is coupled to a gate of the pMOS current source; and
  an output of the second differential amplifier is coupled to a gate of the nMOS current source.

8. The delay equalizer circuit of claim 5, wherein the first differential amplifier outputs a pMOS gate voltage and the second differential amplifier outputs an nMOS gate voltage.

9. The integrated circuit of claim 2, wherein the process monitor is configured to adjust the pMOS and nMOS bias voltages relative to a value of the sensed process corner.

10. The integrated circuit of claim 9, wherein the delay compensator is configured to:
  increase a pMOS reference current in response to an increase in the nMOS bias voltage; and
  decrease the pMOS reference current in response to a decrease in the nMOS bias voltage.

11. The integrated circuit of claim 9, wherein the delay compensator is configured to:
  increase an nMOS reference current in response to a decrease in the pMOS bias voltage; and
  decrease the nMOS reference current in response to an increase in the pMOS bias voltage.

* * * * *